United States Patent [19]
Anma

[11] Patent Number: 5,729,035
[45] Date of Patent: Mar. 17, 1998

[54] NON-VOLATILE SEMICONDUCTOR DEVICE WITH MULTI-LAYERED CAPACITOR INSULATING FILM

[75] Inventor: Masatoshi Anma, Hyogo, Japan

[73] Assignee: Mitsubishi Denki Kabushiki Kaisha, Tokyo, Japan

[21] Appl. No.: 716,847

[22] Filed: Sep. 10, 1996

[30] Foreign Application Priority Data

Nov. 7, 1995 [JP] Japan .................. 7-288767

[51] Int. Cl.$^6$ .................................. H01L 29/792
[52] U.S. Cl. ................... 257/324; 257/316; 257/325
[58] Field of Search .................... 257/315, 316, 257/317, 321, 324, 325

[56] References Cited

U.S. PATENT DOCUMENTS

| | | | |
|---|---|---|---|
| 5,252,846 | 10/1993 | Tanaka et al. | 257/317 |
| 5,289,026 | 2/1994 | Ong | 257/316 |
| 5,304,829 | 4/1994 | Mari et al. | 257/324 |
| 5,379,253 | 1/1995 | Bergemont | 365/185 |
| 5,475,251 | 12/1995 | Kuo et al. | 257/316 |
| 5,554,869 | 9/1996 | Chang | 257/316 |

FOREIGN PATENT DOCUMENTS

| | | |
|---|---|---|
| 2-188970 | 7/1990 | Japan . |
| 3-71674 | 3/1991 | Japan . |
| 5-267684 | 10/1993 | Japan . |

*Primary Examiner*—Ngân V. Ngô
*Attorney, Agent, or Firm*—Lowe, Price, LeBlanc & Becker

[57] ABSTRACT

A structure and a manufacturing method of a semiconductor device which prevents leakage of electric charges from a floating gate electrode to outside. The semiconductor device includes a capacitor insulating film at an upper surface and opposing sidewall surfaces of the floating gate electrode, which film includes a first silicon nitride film, a first silicon oxide film, a second silicon nitride film and a second silicon oxide film stocked in this order from the bottom. In such a structure, the capacitor insulating film prevents electric charges accumulated in the floating gate electrode as information from leaking outside from the vicinity of its end portion A.

2 Claims, 9 Drawing Sheets

NON-VOLATILE SEMICONDUCTOR DEVICE WITH MULTI-LAYERED CAPACITOR INSULATING FILM

BACKGROUND OF THE INVENTION

1. Field of the Invention

The present invention relates to semiconductor devices and manufacturing methods thereof and, more particularly, to a structure of an electrode in a non-volatile memory device and a manufacturing method thereof.

2. Description of the Background Art

Non-volatile memory devices retain the stored electric information even after the power supply is turned off and is capable of storing electric information more than ten years once acquired. Thus, non-volatile memory devices are used for storing operation programs of information devices and data which should not be erased. Typical non-volatile memory devices include an EPROM, an EEPROM and a flash memory. An EPROM electrically writes information and erases the information entirely by radiation of ultraviolet rays, while an EEPROM electrically erases the information instead of using ultraviolet rays what has a disadvantage that its cost per bit is higher. A flash memory is attracting attention as an alternatively media to magnetic media such as a floppy disk since it electrically writes and erases information and the cost per bit is lower than that of an EEPROM.

An example of a structure of flash memories is shown in FIG. 8, which is a structure of a stacked gate type memory cell, most commonly used. The memory cell includes a floating gate electrode 4 for accumulating electric charges as information, and a control gate electrode 10 for controlling provision and reception of the electric charges. A capacitor insulating film 9 is provided between floating gate electrode 4 and control gate electrode 10. A channel region 22 is provided under floating gate electrode 4 with a tunnel oxide film 3 interposed therebetween. In addition, n type source/drain regions 2 are provided on both sides of channel region 2.

Next, description will be made of a channel hot electron (hereinafter referred to as CHE) writing method and a Fowler-Nordheim (hereinafter referred to as FN) type tunnel current erasing method as basic operations of a flash memory with reference to FIGS. 9–13.

Writing is carried out by injecting electrons to the floating gate through injection of CHEs. For example, referring to FIG. 9, a source region 2a is connected to the ground and a voltage of 12 V is applied to Vg of control gate electrode 10 and a voltage of 6 V is applied to Vd of a drain region 2 V, so that a current flows between the source and the drain. At this time, hot electrons 23 are generated at a high electric field region near drain region 2b and injected to floating gate electrode 4 through tunnel oxide film 3 as indicated by an arrow 25. When electrons 24 have been injected to floating gate electrode 4, a threshold voltage Vth for introducing electrons between the source and the drain becomes higher with respect to control gate electrode 10. Such writing operation is completed in approximately 5–10 μsec.

Meanwhile, for read out, source region 2a is connected to the ground and a prescribed voltage Vd is applied to drain region 2b. A prescribed voltage Vg is applied to control gate electrode 10 to observe whether or not a current flows between the source and drain regions, thereby reading out information, i.e. electrons accumulated in floating gate electrode 4.

In contrast, erasing is carried out by extracting electrons accumulated in the floating gate electrode by the FN tunnel current. For example, referring to FIG. 10, control gate electrode 10 is connected to the ground and a voltage Vs is applied to source region 2a. Through tunnel oxide film 3 located at a region where source region 2a and floating gate electrode 4 are overlapped, hot electrons 24 in floating gate electrode 4 are "Fowler-Nordheim tunneled" to source region 2a. After hot electrons 24 in floating gate electrode 4 are eliminated, threshold voltage Vth becomes lower with respect to control gate electrode 10. Such erasing operation is completed in 0.1–1 sec.

It is assumed that an intermediate voltage between a threshold voltage Vth1 when hot electrons have been injected to the floating gate electrode and a threshold voltage Vth2 when hot electrons have been extracted from the floating gate electrode is a sense voltage Vcc. Determination can be made whether data is written or not by observing whether or not a current flows between the source and the drain when the sense voltage is applied to the control gate electrode. More specifically, no current flows between the source and the drain when hot electrons have been injected to the floating gate electrode and such a state can be determined as the state where information is written; and a current flows between the source and the drain when hot electrons are extracted from the floating gate and such a state can be determined as the state where information is erased.

Operation characteristics are greatly affected by the quality of the tunnel oxide film and the capacitor insulating film which are in contact with the floating gate electrode. For example, the potential of the control gate electrode can be more efficiently transmitted to the floating gate electrode with a thinner capacitor insulating film. However, the thinner capacitor insulating film gives rise to an increase in defect thereof, whereby electric charges accumulate in the floating gate electrode leak had the electric charges cannot be held for a long period of time as information. Therefore, in the capacitor insulating film an ONO structure is employed which consists of three layers, silicon oxide films and a silicon nitride film interposed therebetween. However, such ONO has a limit to prevent leakage of electric charges, improve charge retaining characteristics, and to cope with large storage capacity of 16M or greater. In order to solve this problem, an NONO structure further including a nitride film under such ONO film as shown in FIGS. 11 and 12 is disclosed in Japanese Patent Laying-Open Nos. 5-267684 and 2-188970. In such structures, a capacitor insulating film 9 has a four-layer structure consisting of a first nitride film 5, a first oxide film 6, a second nitride film 7 and a second oxide film 8 stacked on floating gate electrode 4.

Such a structure is formed as follows. Referring to FIG. 13, a polysilicon film 4 is deposited on a semiconductor substrate 1 with a tunnel oxide film 3 interposed therebetween. Referring to FIG. 14, on polysilicon film 4, first nitride film 5, first oxide film 6, second nitride film 7, and second oxide film 8 are deposited in this order. Referring to FIG. 15, a polysilicon film 10 doped with phosphorus is deposited and prescribed photolithography and processing are performed. Next, a silicon oxide film 12 is deposited to cover polysilicon film 10 to form the structure shown in FIG. 11.

Such capacitor insulating film still cannot avoid malfunction which is characteristic of a flash memory and a writing from the capacitor insulating film.

This malfunction is so-called gate disturbed failure, which has two modes of extraction mode and injection mode. In extraction mode, during writing operation of a selected particular cell bit as indicated by a circle in A in FIG. 16, electrons 24 in non-selected another cell bit indicated by a circuit B in FIG. 16 are undesirably extracted through capacitor insulating film 9 as shown by an arrow 27 in FIG. 17 by the gate electric field. In injection mode, at another cell bit in an erased state, electrons are injected from the substrate as indicated by arrow 25 in FIG. 17 by the gate electric field to undesirably attain a written state.

Since gate disturb failure is caused by leakage of electric charges at the tunnel oxide film or the capacitor insulating film, various approaches are taken for the tunnel oxide film such as optimization of film forming conditions of the film and cleaning process of the semiconductor substrate before the film is formed and relaxation of the electric applied to the end portion of the drain. Regarding the capacitor insulating film, improvement in leakage characteristics of the insulating film itself and planarization of the surface of the floating gate electrode are sought to include insulation characteristics.

Since typical structure of a gate electrode such as that of a flash memory has a sidewall surface of the stacked NONO films in flash with the sidewall surface of the control gate electrode 10 and floating gate electrode 4, the sidewall surface of floating gate electrode 4 is not covered with the capacitor insulating film. In addition, electric charges tend to concentrate at an end portion A of the sidewall surface of floating gate electrode 4. As a result, electric charges easily leak from end portion A of the floating gate electrode. It is difficult to suppress this phenomena even through the quality of NONO films are improved and leakage characteristics are enhanced because of its structural problem. Therefore, failure to the extraction mode is generated.

Conventionally, the structure of a gate electrode of a non-volatile memory has a control gate electrode and a floating gate electrode, and NONO films are employed as a capacitor insulating film therebetween. Furthermore, the sidewall surface of the stacked NONO films is coplanar with the side surfaces of the control gate electrode and the floating gate electrode. Consequently, electric charges concentrated and accumulated at the end portion of the sidewall surface of the fourteenth gate electrode leak from the vicinity of the end portion which is not covered with the capacitor insulating film, thereby causing gate disturbed failure. In other words, electric charges accumulated at the floating gate electrode leak to undesirably change information.

SUMMARY OF THE INVENTION

An object of the present invention is to provide a semiconductor device which suppresses leakage of electric charges from the vicinity of the end portion of the fourteenth gate electrode and exempt in charge retaining characteristics.

Another object of the present invention is to easily manufacture a semiconductor device which suppresses leakage of electric charges from the vicinity of the end portion of the fourteenth gate electrode in a method of manufacturing a semiconductor device.

A semiconductor device according to a first aspect of the present invention includes a first conductive film and a multi-layered film. The first conductive film is formed on a semiconductor substrate with an insulating film interposed therebetween and having opposing side surfaces. The multi-layered film is formed on an upper surface and the opposing side surfaces of the first conductive film and includes a nitride film.

Electric charges can be prevented from leaking to outside from the vicinity of end portions of the opposing sidewall surfaces of the first conductive film.

The multi-layered film has opposing side surfaces substantially in parallel to the side surfaces of the first conductive film, and an upper surface substantially in parallel to the upper surface of the first conductive film. Preferably, the semiconductor device may further include a second conductive layer formed only on the upper surface of the multi-layered film and having opposing side surfaces substantially coplanar with the opposing side surfaces of the multi-layered film.

Thus, a flow of electric charges accumulated in the first conductive layer can be controlled by a voltage applied to the second conductive film.

A semiconductor device according to a second aspect of the present invention includes first and second gate electrodes, a pair of impurity regions, and a multi-layered film. The first gate electrode is formed on a semiconductor substrate with an insulating film interposed therebetween. The pair of impurity regions are formed at the semiconductor substrate on both sides of the first gate electrode. The multi-layered film is formed on an upper surface and opposing side surfaces of the first gate electrode and includes a nitride film and an oxide film. The second gate electrode is formed on the multi-layered film and has opposing side surfaces. The multi-layered film has opposing side surfaces substantially in parallel to the opposing side surfaces of the first gate electrode, and an upper surface substantially in parallel to the upper surface of the first gate electrode. The second gate electrode is formed only on the upper surface of the multi-layered film. The opposing side surfaces of the second gate electrode is substantially coplanar with the opposing side surfaces of the multi-layered film.

With such a structure, the upper surface and the opposing sidewall surfaces of the first gate electrode are covered with the multi-layered film. As a result, electric charges stored in the first gate electrode can be prevented from leaking to outside from the vicinity of the end portion of the first gate electrode. Therefore, a highly reliable semiconductor device with excellent charge retaining characteristics can be obtained.

Preferably, the multi-layered film may include a first nitride film, a first oxide film, a second nitride film and a second oxide film formed on the first gate electrode in this order. With such a structure, electric charges accumulated at the first gate electrode can be prevented even more effectively from leaking outside from the vicinity of the end of the first gate electrode. Therefore, a highly reliable semiconductor device with excellent charge retaining characteristics can be obtained.

A method of manufacturing a semiconductor device according to a third aspect of the present invention includes the steps of: depositing a first conductive film on a semiconductor substrate with an insulating film interposed therebetween; patterning the first conductive film in a prescribed manner to form a first gate electrode; forming a pair of impurity diffusion regions at the semiconductor substrate on both sides of the first gate electrode by using the first gate electrode as a mask; forming a capacitor insulating film by depositing a first nitride film, a first oxide film, a second nitride film, and a second oxide film in this order on the semiconductor substrate including the first gate electrode; forming a second conductive film on the second oxide film; forming a prescribed photoresist pattern on the second conductive film; and anisotropically etching the second conductive film and a capacitor insulating film by using the photoresist pattern as a mask to form a second gate electrode which has opposing sidewall surfaces substantially coplanar with surfaces of the capacitor insulating film formed on the sidewall surfaces of the first gate electrode.

With such a method, an upper surface and opposing sidewall surfaces of the first gate electrode can be covered with the capacitor insulating film, so that electric charges accumulated at the first gate electrode will not leak to outside from the vicinity of the end portion of the first gate electrode. Therefore, a semiconductor device with excellent charge retaining characteristics can be easily formed.

The first and second conductive films can be formed by reacting with gate including $SiH_4$ and $PH_3$ under the temperature of 500°–550° C.

The first nitride film can be formed by nitriding the conductive film with use of gas including $NH_3$ under the temperature of 750°–900° C.

The first and second silicon nitride films can be formed by reaction with gas including $SiH_2Cl_2$ and $NH_3$ under the temperature 700°–800° C.

The first and second silicon oxide films can be formed by reaction with gas including $SiH_4$ and $N_2O$ or $SiH_2Cl_2$ and $N_2O$ under the temperature of 700°–900° C.

The second oxide film can be formed by thermal oxidation under the temperature of 700°–1000° C.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
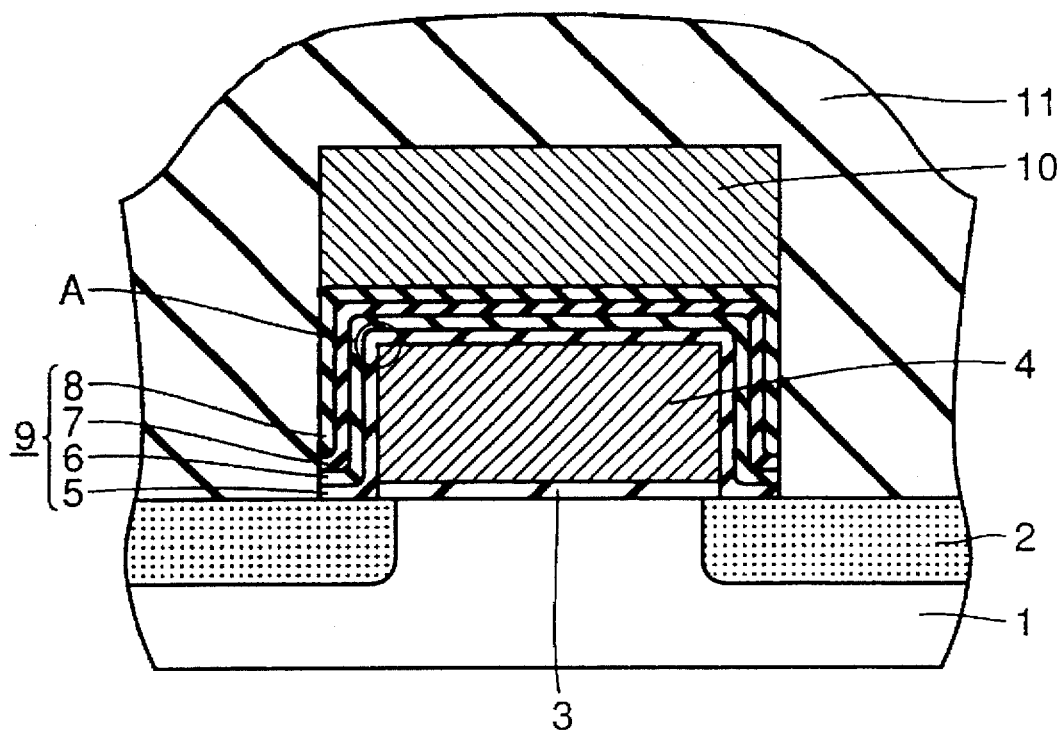
FIG. 1 is a cross sectional view showing an example of a structure of a semiconductor device according to a first embodiment of the present invention.

Now, a semiconductor device according to the present invention will be described with reference to the drawing as the first embodiment.

Referring to FIG. 1, floating gate electrode 4 including a phosphorus-doped polysilicon film is provided on semiconductor substrate 1 with tunnel oxide film 3 interposed therebetween. On an upper surface and opposing sidewall surfaces of floating gate electrode 4, capacitor insulating film 9 is provided which is formed by depositing a first silicon nitride film 5, a first silicon oxide film 6, and a second silicon nitride film 7, and a second silicon oxide film 8 on floating gate electrode 4 in this order. A control gate electrode 10 including a phosphorus-doped polysilicon film is provided on capacitor insulating film 9, i.e. on second silicon oxide film 8. Opposing sidewall surfaces of control gate electrode 10 are substantially coplanar with the surfaces of capacitor insulating film 9 formed on the opposing sidewall surfaces of floating gate electrode 4. At semiconductor substrate 1, n type source/drain regions 2 are provided at both sides of floating gate electrode 4. A silicon oxide film 11 is provided to cover the gate electrode including control gate electrode 10 and floating gate electrode 4.

Structured as such, capacitor insulating film 9 covers not only the upper surface of floating gate electrode 4 but also end portion A and opposing sidewall surfaces of floating gate electrode 4. As a result, electric charges accumulated as information at floating gate electrode 4 will now easily leak from end portion A of floating gate electrode 4 where electric charges tend to concentrate, thereby improving charge retaining characteristics of electrode 4. Therefore, a semiconductor device highly reliable in operations can be obtained.

While description is made of the structure in the vicinity of the gate electrode of a flash memory in the present embodiment, application can be made also in other semiconductor devices. For example, leakage of electric charges in the conductive layer to outside can be suppressed by covering the conductive film such as a polysilicon film with the multi-layered film including a nitride film. Therefore, a highly reliable semiconductor device can be obtained.

Second Embodiment

One example of a method of manufacturing the semiconductor device described in the first embodiment will be described below with reference to the drawings.

Figure 2:
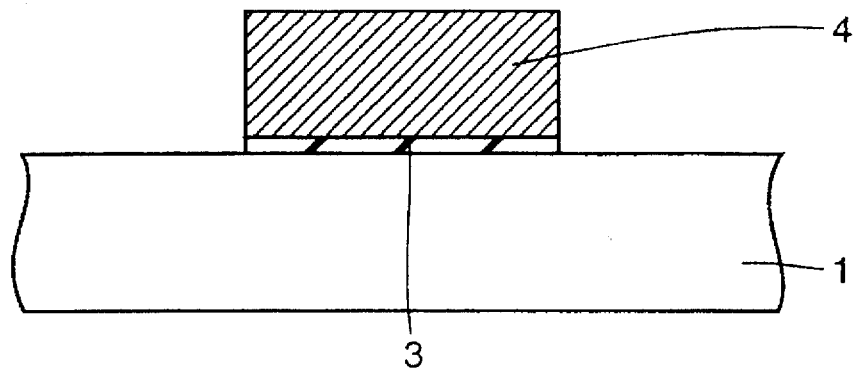
FIG. 2 is a cross sectional view showing one step in a method of manufacturing a semiconductor device according to a second embodiment of the present invention.
Figure 3:
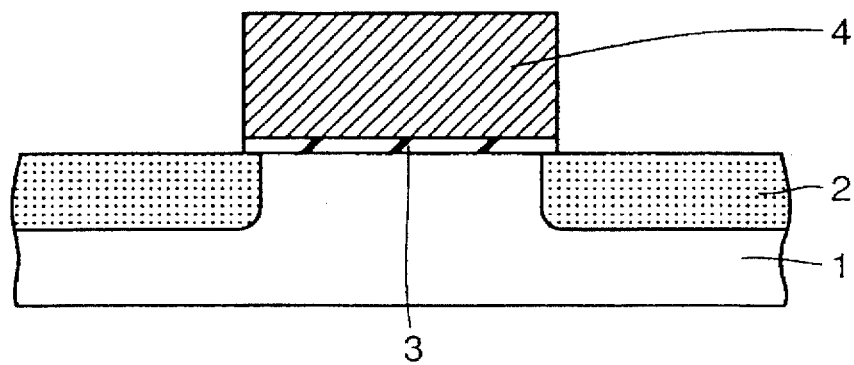
FIG. 3 is a cross sectional view showing a step subsequent to the step shown in FIG. 2 in the second embodiment of the present invention.
Figure 4:
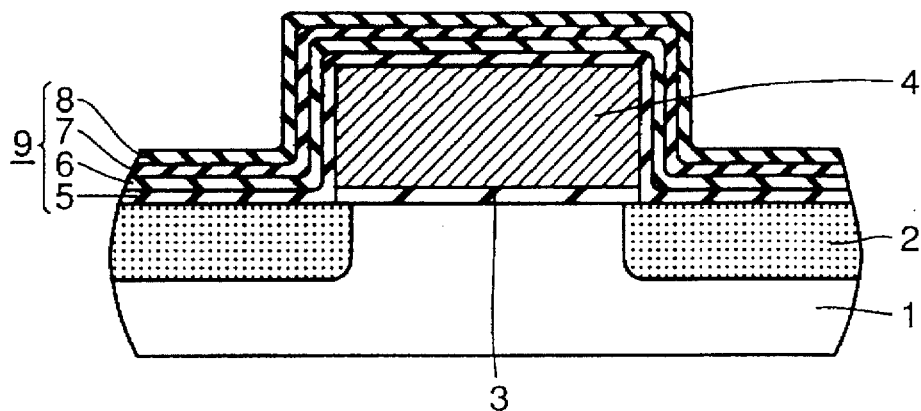
FIG. 4 is a cross sectional view showing a step subsequent to the step shown in FIG. 3 in the second embodiment of the present invention.
Figure 5:
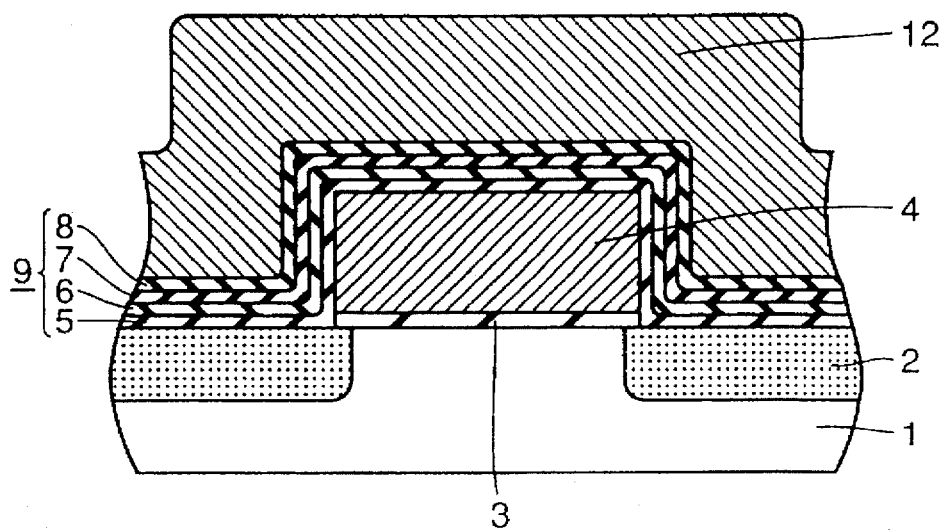
FIG. 5 is a cross sectional view showing a step subsequent to the step shown in FIG. 4 in a second embodiment of the present invention.
Figure 6:
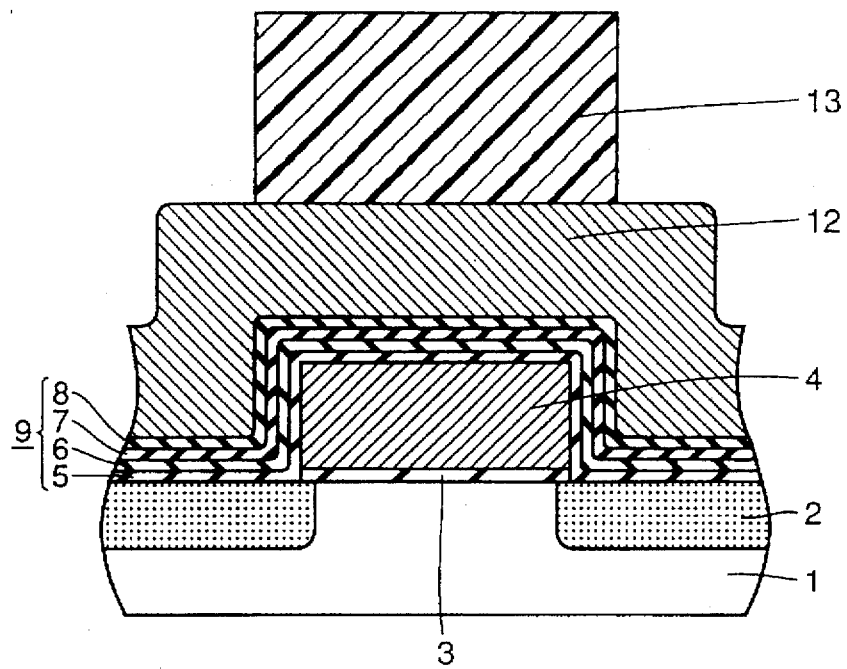
FIG. 6 is a cross sectional view showing a step subsequent to the step shown in FIG. 5 in the second embodiment of the present invention.
Figure 7:
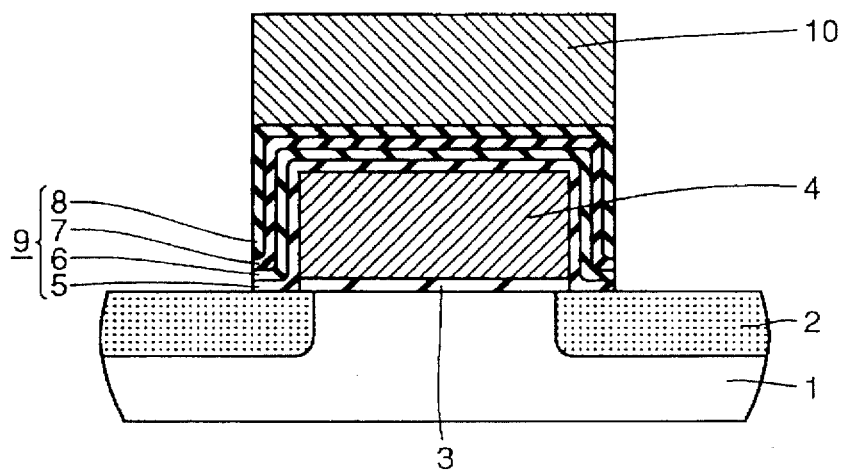
FIG. 7 is a cross sectional view showing a step subsequent to the step shown in FIG. 6 in the second embodiment of the present invention.
Figure 8:
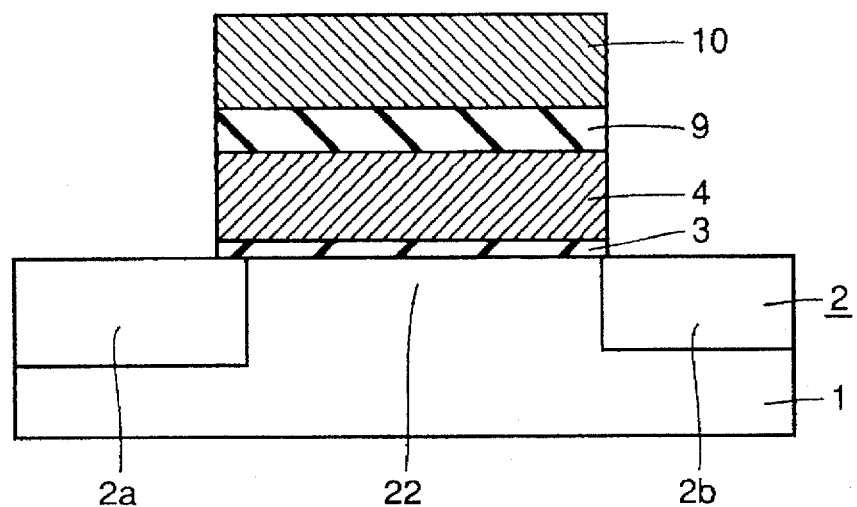
FIG. 8 is a cross sectional view showing an example of a structure of a gate electrode of a conventional flash memory.
Figure 9:
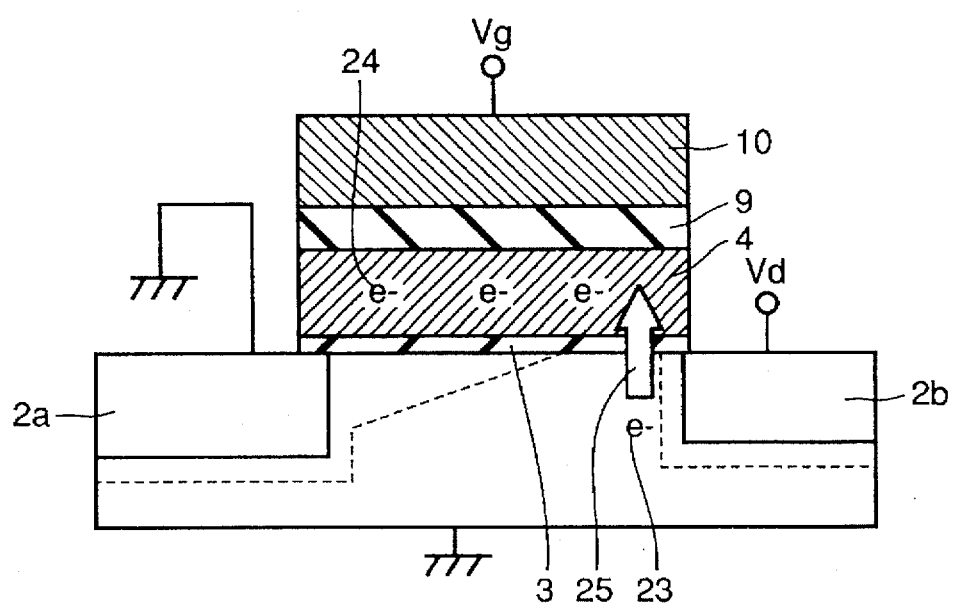
FIG. 9 is a cross sectional view for describing an example of basic operation of a conventional flash memory.
Figure 10:
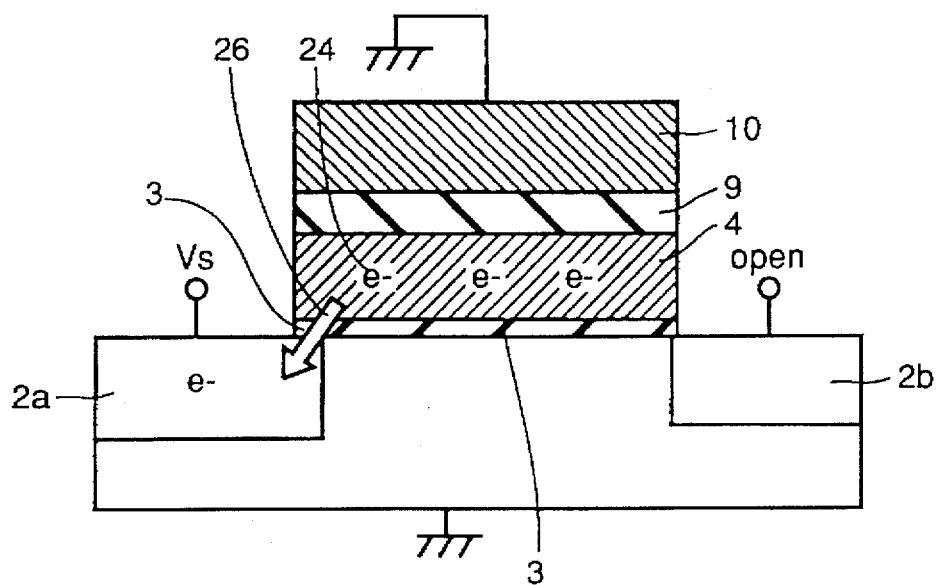
FIG. 10 is a cross sectional view showing another example of basic operation of a conventional flash memory.
Figure 11:
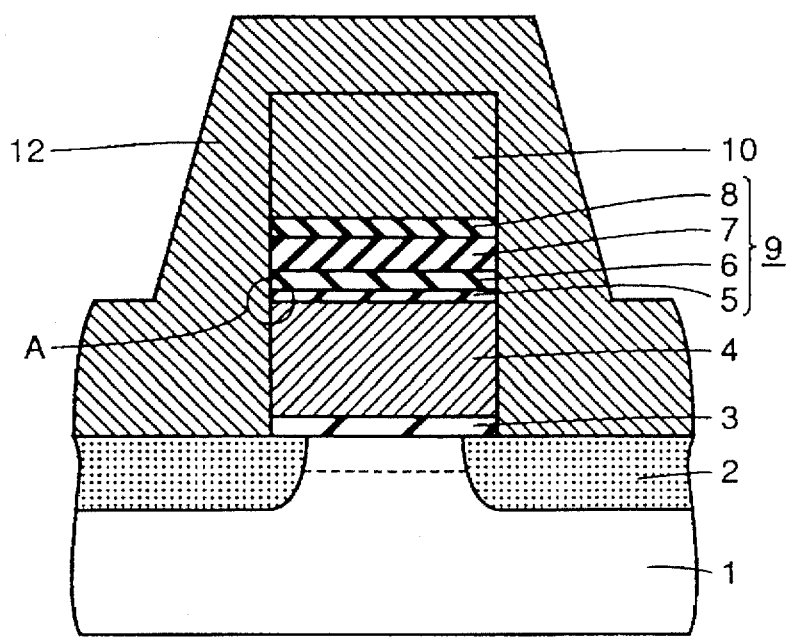
FIG. 11 is a cross sectional view showing another example of a structure of a gate electrode of a conventional flash memory.
Figure 12:
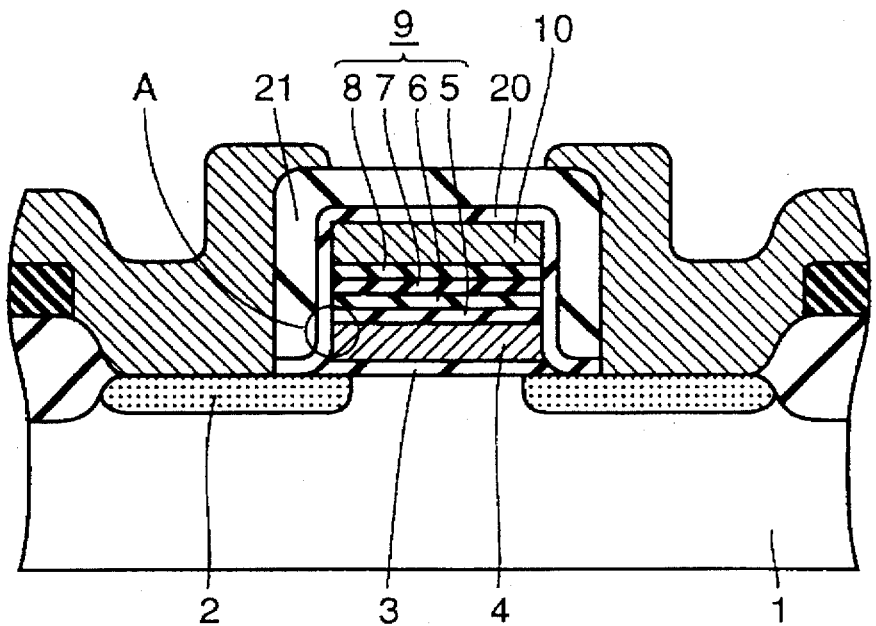
FIG. 12 is a cross sectional view showing still another example of a structure of a gate electrode of a conventional flash memory.
Figure 13:
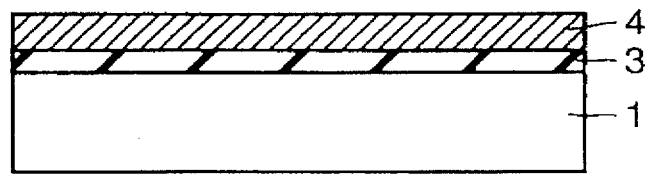
FIG. 13 is a cross sectional view showing a step in a method of manufacturing a conventional flash memory.
Figure 14:
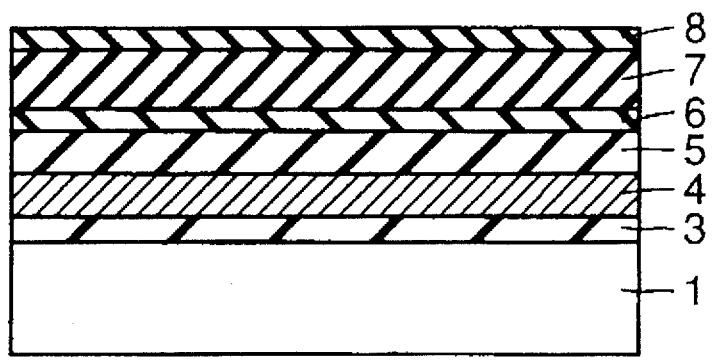
FIG. 14 is a cross sectional view showing a step subsequent through the step shown in FIG. 13 in the method of manufacturing a conventional flash memory.
Figure 15:
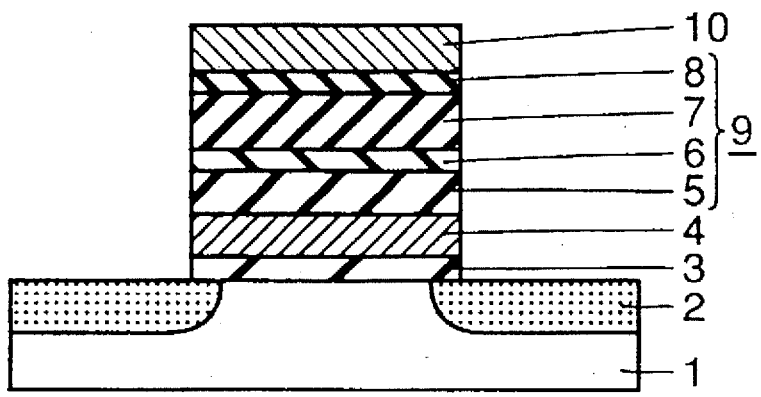
FIG. 15 is a cross sectional view showing a step subsequent to the step shown in FIG. 14 in the method of manufacturing a conventional flash memory.
Figure 16:
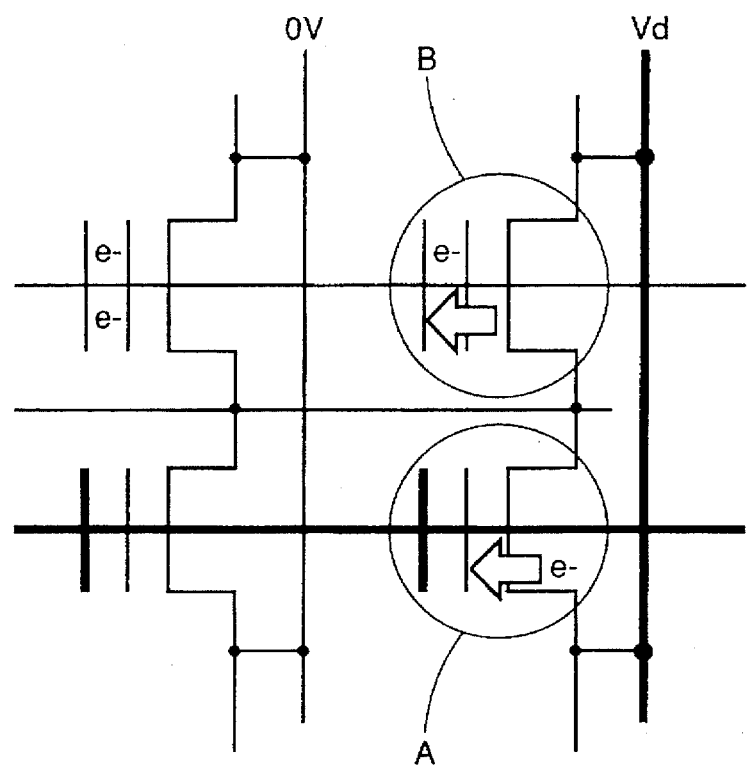
FIG. 16 is a diagram showing an example of a circuit including a conventional flash memory.
Figure 17:
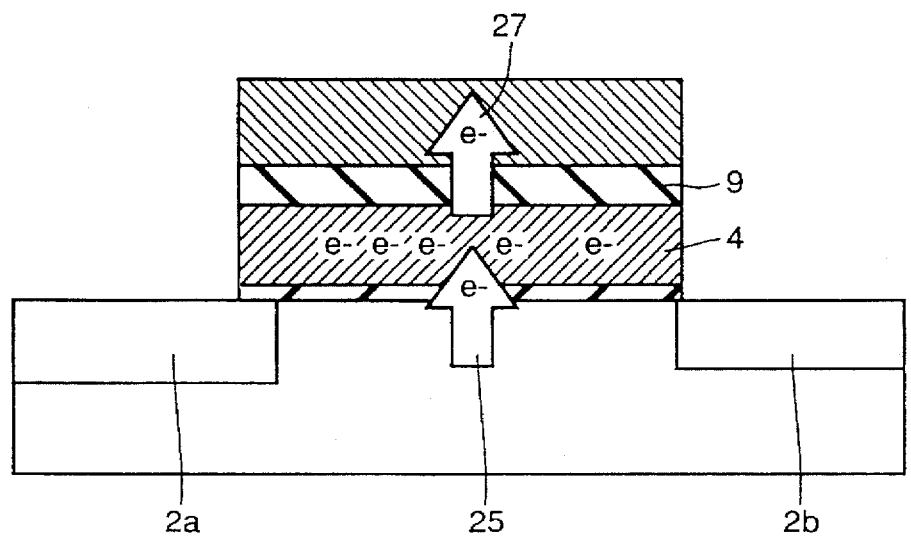
FIG. 17 is a cross sectional view for describing a problem of a conventional flash memory.

Referring to FIG. 2, semiconductor substrate 1 is thermally oxidized to form tunnel oxide film 3. On tunnel oxide film 3, gas including $SiH_4$ and $PH_3$ is reacted under the temperature of 500°–550° C. to form a phosphorus-doped amorphous silicon through CVD method. After the prescribed photography and anisotropic etching processes are performed, floating gate electrode 4 is formed. Referring to FIG. 3, ions of phosphorus are implanted by using floating gate electrode 4 or a photoresist (not shown) for patterning floating gate electrode 4 as a mask to form a pair of n type source/drain regions 2 at semiconductor substrate 1 on both sides of floating gate electrode 4. Under the temperature of 800°–900° C., gas phase etching is performed on floating gate electrode 4 by using $SiH_4$-added $H_2$ to remove oxide films with bad film quality such as a natural oxide film formed at the surface of the phosphorus-doped amorphous silicon film. After removal, capacitor insulating film 9 is formed as shown in FIG. 4. More specifically, gas including $SiH_2Cl_2$ and $NH_3$ is reacted under the temperature of 700°–800° C. and formed silicon nitride film 5 to cover the surface of floating gate electrode 4 by CVD method. Next, gas including $SiH_4$ and $N_2O$ is reacted under the temperature of 700°–900° C. to form silicon oxide film 6 on silicon nitride film 5 by CVD method. Next, gas including $SiH_2Cl_2$ and $NH_3$ is reacted under the temperature of 700°–800° C. to form silicon nitride film 7 on silicon oxide film 6 by CVD method. Subsequently, gas including $SiH_4$ and $N_2O$ is reacted under the temperature of 700°–900° C. to form silicon oxide film 8 on silicon nitride film 7. During these steps, the phosphorus-doped amorphous silicon film forming floating gate electrode 4 is crystallized through heat to become a phosphorus-doped polycrystalline silicon film. Referring to FIG. 5, gas including $SiH_4$ and $PH_3$ is reacted under the temperature of 620° C. and formed the phosphorus-doped polycrystalline silicon film on silicon oxide film 8 by CVD method. Referring to FIG. 6, a prescribed photoresist pattern 13 is formed on capacitor insulating film 9 which is formed on the upper surface of floating gate electrode 4. Referring to FIG. 7, using photoresist pattern 13 as a mask, the phosphorus-doped polycrystalline silicon film and the capacitor insulating film are anisotropically etched and formed control gate electrode 10 having opposing sidewall surfaces which are substantially coplanar with the surfaces of capacitor insulating film 9 formed on the opposing sidewall surfaces of floating gate electrode 4. Photoresist pattern 13 is then removed, and silicon oxide film 11 is formed to cover control gate electrode 10. The semiconductor device as shown in FIG. 1 can be formed by the steps described above.

Although silicon nitride film 5 is formed by CVD method in the embodiment described above, the film can be formed through thermal nitrification by reacting gas including $NH_3$ with the surface of floating gate electrode under the temperature of 700°–800° C.

Thus, the upper surface and opposing sidewall surfaces of floating gate electrode 4 are covered with capacitor insulating film 9, so that a structure preventing leakage of electric charges stored in floating gate electrode 4 to outside can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a first gate electrode formed on a semiconductor substrate with an insulating film interposed therebetween;

a pair of impurity regions formed at said semiconductor substrate on both sides of said first gate electrode;

a multi-layered film formed on an upper surface and opposing side surfaces of said first gate electrode so as to continuously extend from one of the opposing side surfaces to the other of the opposing side surfaces via the upper surface, the multi-layered film including a nitride film and an oxide film; and a second gate electrode formed on said multi-layered film and having opposing side surfaces; wherein said multi-layered film has opposing side surfaces substantially in parallel to the opposing side surfaces of said first gate electrode, and an upper surface substantially in parallel to the upper surface of said first gate electrode, said second gate electrode is formed only on the upper surface of said multi-layered film, and said opposing side surfaces of said second gate electrode are substantially coplanar with said opposing side surfaces of said multi-layered film.

2. The semiconductor device according to claim 1, wherein said multi-layered film includes a first nitride film, a first oxide film, a second nitride film, and a second oxide film formed on said first gate electrode in this order.

* * * * *